Figure 1:
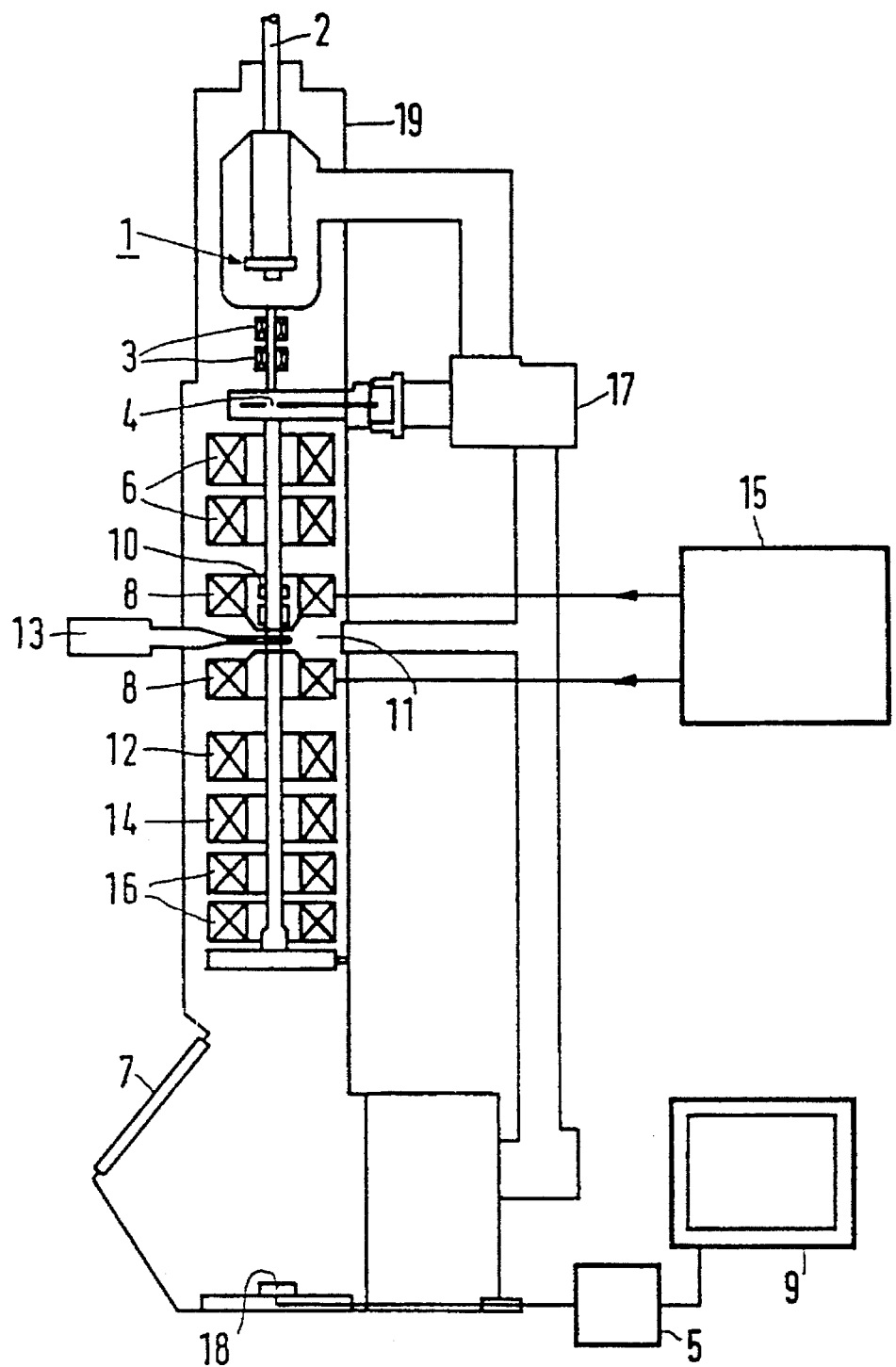

United States Patent [19]

Kruit

[11] Patent Number: 5,587,586
[45] Date of Patent: Dec. 24, 1996

[54] PARTICLE-OPTICAL APPARATUS COMPRISING AN ELECTRON SOURCE WITH A NEEDLE AND A MEMBRANE-LIKE EXTRACTION ELECTRODE

[75] Inventor: Pieter Kruit, Delft, Netherlands

[73] Assignee: U.S. Philips Corporation, New York, N.Y.

[21] Appl. No.: 538,512

[22] Filed: Oct. 3, 1995

[30] Foreign Application Priority Data

Oct. 3, 1994 [EP] European Pat. Off. .............. 94202853

[51] Int. Cl.⁶ .................................................. H01J 37/073
[52] U.S. Cl. .................................. 250/423 F; 250/442.11; 313/336
[58] Field of Search .......................... 250/423 F, 442.11, 250/306; 313/336; 315/387

[56] References Cited

U.S. PATENT DOCUMENTS

| 3,665,241 | 5/1972 | Spindt et al. | 250/423 F |
| 4,427,886 | 1/1984 | Martin et al. | 250/310 |
| 4,880,975 | 11/1989 | Nishioka et al. | 250/423 F |
| 4,954,711 | 9/1990 | Fink et al. | 250/423 F |
| 5,059,804 | 10/1991 | Fink et al. | 250/423 F |
| 5,300,775 | 4/1994 | Van Der Mast | 250/305 |

FOREIGN PATENT DOCUMENTS 0366851  5/1990  European Pat. Off. .

Primary Examiner—Bruce C. Anderson

[57] ABSTRACT

The source can be readily aligned and the energy spread of the emitted bean can be controlled to an arbitrarily small value by variation of the voltage. Since no high voltage is present within the emissive part of the electron source, a very compact electron source can be realized.

17 Claims, 4 Drawing Sheets

PARTICLE-OPTICAL APPARATUS COMPRISING AN ELECTRON SOURCE WITH A NEEDLE AND A MEMBRANE-LIKE EXTRACTION ELECTRODE

The invention relates to a particle-optical apparatus, comprising an electron source for producing a beam of free electrons, provided with a needle-shaped conductor, a membrane-like, electrically conductive extraction-electrode which is arranged opposite to and at a small distance from the tip of the needle-shaped conductor, and means for applying an electric voltage between the needle-shaped conductor and the extraction-electrode.

BACKGROUND OF THE INVENTION

An electron source for use in such a particle-optical apparatus is known from European Patent EP 0 366 851.

A variety of electron sources are commonly known for use in particle-optical apparatus. Known are thermal emitters of metal or metal oxides, field emission sources, semiconductor emitters, Schottky emitters and Metal-Isolator-Metal (MIM) cathodes. For use in particle-optical apparatus (for example electron microscopes), generally speaking source properties such as high brightness, constant beam current, small energy spread of the electrons in the emitted beam, mechanical ruggedness of the electron source and simplicity of construction are desired. Depending on the field of application of the electron-optical apparatus, different ones of these properties will be emphasized.

The cited EP Patent document describes an electron source in which a tungsten needle is arranged opposite an extraction-electrode of a thickness of less than 1 µm. The tungsten needle is shaped so that it has a tip of atomic sharpness, i.e. its tip is formed by a single atom or by a group of, for example three atoms ("trimer"). The extraction-electrode is provided with a round aperture whose diameter is of the order of magnitude of the thickness of this electrode. Elsewhere in the cited Patent document it is stated that the distance between the tip and the aperture is of the order of magnitude of the diameter of the aperture whereas this distance is between 1 and 10 nanometers. No further indication as regards the size of the aperture can be derived from the cited Patent Document.

As is known, the brightness of an electron source (at constant current and emission space angle) is inversely proportional to the magnitude of the emitting surface, so that this electron source enables a high brightness to be achieved because of the sharpness of the tip of its needle.

The sharpness of the tip of the needle is of essential importance in the known electron source. However, much effort is required to provide the needle with such a sharp tip. Moreover, the needle must be arranged accurately opposite the centre line of the aperture in the extraction-electrode and the distance between the needle and the extraction-electrode also has to be monitored constantly. Finally, in this known configuration special steps will be required to prevent or compensate for changes (for example, due to thermal effects) in this alignment.

The aperture in the extraction-electrode of the known electron source must be very accurately circular, because otherwise astigmatism or other deformation of the electron beam occurs; this is inadmissible for practically all applications of such an electron source. However, it is objectionable to form an aperture of such a diameter (i.e. 1 µm or of the order of magnitude of from 1 to 10 nm) so as to be round with the required accuracy.

SUMMARY OF THE INVENTION

It is an object of the invention to provide a particle-optical apparatus of the kind set forth which comprises an electron source of simpler construction which also can be operated more easily.

To this end, the particle-optical apparatus in accordance with the invention is characterized in that the membrane-like extraction-electrode is completely closed and the thickness of the extraction-electrode is such that a practical fraction of the electrons incident on the membrane under the influence of the electric voltage traverses the membrane to its other side with an energy loss which is negligibly small for all practical purposes.

The needle distance, the membrane thickness and the needle voltage of the electron source can be chosen to be such so that a usable part of the electrons emanating from the needle tip passes through the extraction-electrode and emanates on the other side of this electrode as an electron beam. Subsequently, if desired, further manipulations such as post-acceleration or focusing of this beam can take place. If the electron source is to operate with a constant beam current, the leakage current in the extraction-electrode can be used as a control variable, because this current amounts to a fixed fraction of the beam current.

A major advantage of this electron source over the known electron source consists in that, as will be described in detail hereinafter, the energy spread in the electron source in accordance with the invention is adjustable and can be given a very low value, if desired.

The aperture in the extraction-electrode is completely absent in the electron source in accordance with the invention, so that the severe requirements as regards the shape of the aperture and the alignment of the needle are no longer relevant. Moreover, the needle need no longer be manufactured with atomic sharpness; it suffices to provide the needle with a tip by means of a conventional technique. At a microscopic scale the needle tip will still exhibit a given irregularity, so that protrusions will always remain present. The protrusion which happens to be situated nearest to the extraction-electrode then automatically acts as the emission point. If necessary, the source parameters (distance between needle and membrane, needle voltage, choice of a suitable location on the membrane) can be optimized during emission of the beam. This is often objectionable in the known electron source, because this electron source produces a beam only after it has been suitably aligned. In the electron source in accordance with the invention it is in principle irrelevant where the needle tip is situated, i.e. opposite which part of the extraction-electrode. It is only important that the needle is situated at the correct distance from the membrane, so that in the case of an extraction-electrode of uniform thickness the needle need be positioned in one direction only (the z-direction) as opposed to the known electron source in which positioning in three directions is required (i.e. also in the x-direction in the y-direction).

An additional advantage of the invention consists in that the use of a completely closed membrane allows for the needle voltage to be much lower than in the case of an extraction-electrode comprising an aperture. This is because the electrode can be arranged at an arbitrarily short distance from the surface in the case of a completely closed membrane, so that the voltage can be reduced in proportion. Even though the needle can also be positioned close to the plane of the electrode in the case of an extraction-electrode comprising an aperture, the needle tip will then project into the aperture so that the distance between the tip of the needle and the material of the electrode cannot be made arbitrarily small.

Because of the low needle voltage, the electrons incident on the extraction-electrode have a penetrating power which suffices to regain, on the exit side of the extraction-electrode, a fraction of the electrons incident on the membrane which is sufficiently large for all practical purposes with an energy loss which is negligibly small for all practical purposes. This phenomenon is due to the fact that the active cross-section of the atoms in the electron material for collisions with electrons is strongly dependent on the energy of the electrons. This cross-section exhibits a maximum for a value of the order of magnitude of 50 eV and strongly decreases for lower values of the electron energy. Therefore, it is advantageous to choose the needle voltage, i.e. the electron energy, to be as low as possible.

The energy spread of the beam can be adjusted in that in accordance with the invention the means for applying an electric voltage between the needle-shaped conductor and the extraction-electrode are adjustable to a value which exceeds the internal potential of the material of the extraction-electrode by an amount of between 1 mV and 1 V. The energy spread of the beam will then have substantially the value which corresponds to the amount in excess of the exit voltage, so that the energy spread of the beam can be limited to the order of magnitude of 25 mV (i.e. the thermal spread associated with an ambient temperature of 300° K.).

In conformity with a further step of the invention, the electron source comprises means for varying the distance between the needle tip and the extraction electrode during operation of the electron source. This possibility of variation can be utilized to adjust the source current to a desired value. If desired, the distance to the extraction-electrode can be used for coarse control and the needle voltage for fine control. Distance control is attractive notably when the electron source is to be adjusted again after installation of a new needle.

During manufacture of a membrane-like extraction-electrode it may occur that the thickness of this electrode is not uniform throughout. In such a case it is useful to make the electron source emit during its adjustment and to search, in the vicinity of the emission spot, for an area of optimum thickness in the extraction-electrode. In order to facilitate this search, the electron source in accordance with the invention is provided with means for moving the needle tip parallel to the surface of the extraction-electrode during operation of the electron source.

Another embodiment yet of the electron source in accordance with the invention is characterized in that the extraction-electrode is mechanically integral with further particle-optical elements for manipulating the beam of free electrons. For example, on its side which is remote from the needle the extraction-electrode is provided with a variety of conductive and/or insulating patterns which constitute electron-optical components. Examples in this respect are an acceleration electrode, a source lens or a deflector. It is also possible to subdivide an annular electrode into segments by way of interruptions in order to create a deflection field or a multipole effect in this manner.

Another embodiment of the invention is characterized in that the extraction-electrode also acts as a vacuum wall which constitutes a boundary between a vacuum space and the environment, the needle-shaped conductor being present in said environment. For suitable operation of the electron source in accordance with the invention the needle need not be present in vacuum; it may also be present in an environment which has been conditioned or not, for example an environment with atmospheric pressure. This makes the electron source readily accessible, thus facilitating its use.

Another embodiment yet of the invention is characterized in that the means for applying an electric voltage between the needle-shaped conductor and the extraction-electrode are arranged to apply a pulsed voltage.

The properties of the electron source in accordance with the invention make it particularly suitable for the production of very brief pulses of the beam current with a very high pulse repetition frequency which may be higher than 1 GHz. This possibility is due to the following properties:

1. Even though the voltage difference between the needle and the extraction-electrode is of the order of magnitude of a few volts, the electrons are accelerated only by an amount of the order of magnitude of 50 meV (beyond the exit voltage); as a result, only a small voltage swing (i.e. 50 mV) is necessary to vary the beam current between zero and the maximum value.

2. Because of the low voltages within the electron source, it can be constructed so as to have very small dimensions. As a result, parasitic capacitances decrease in proportion so that the switching time of the pulses can also be increased.

BRIEF DESCRIPTION OF THE DRAWING FIGURES

Figure 2:
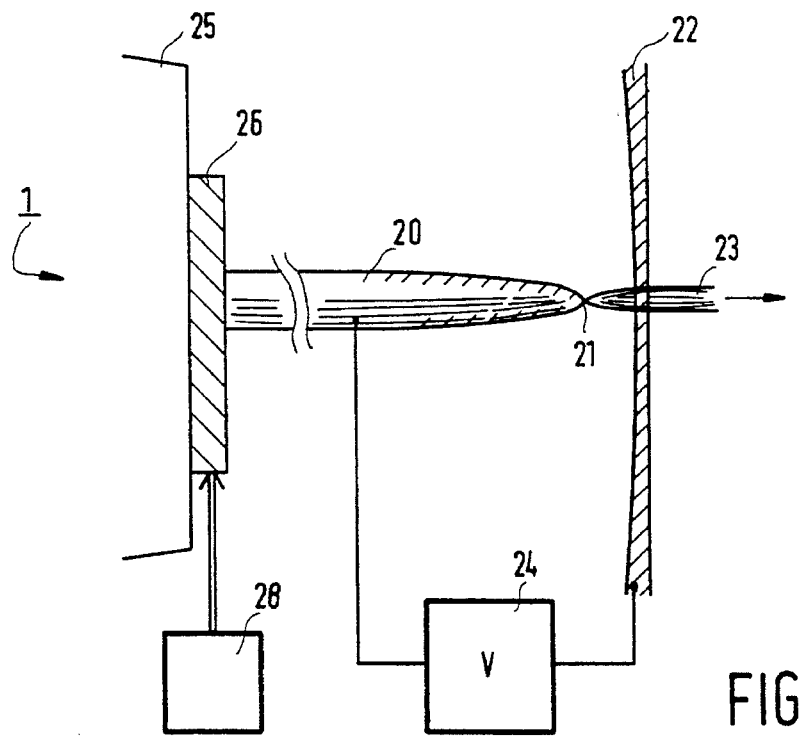
Figure 3:
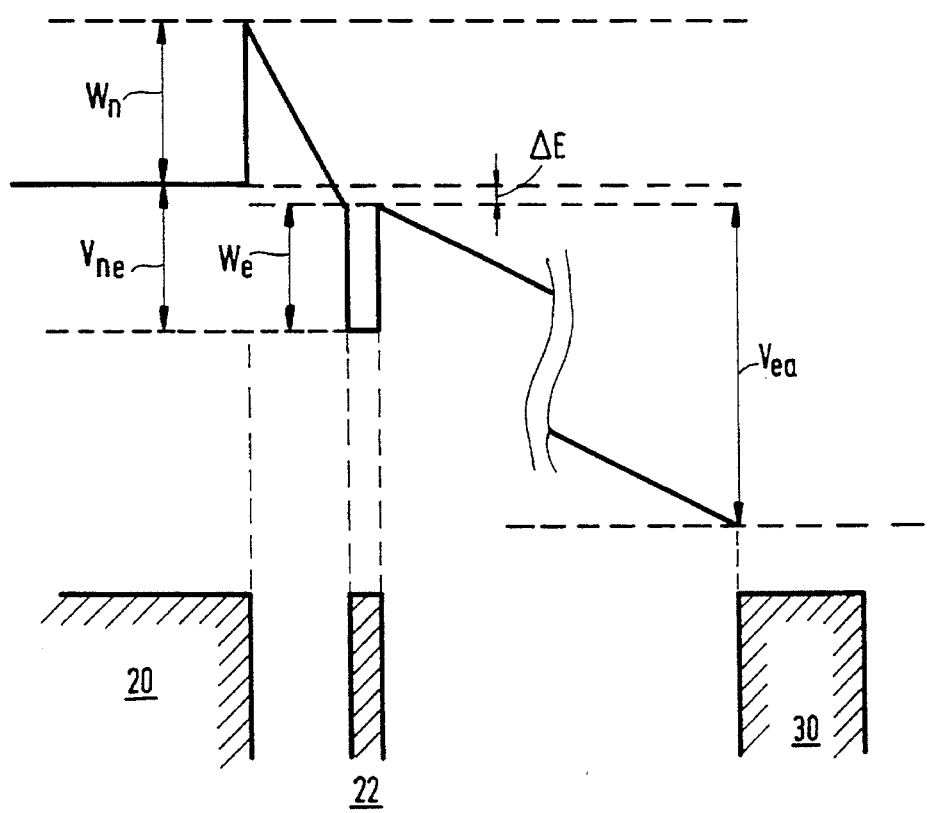
Figures 4A, 4B:
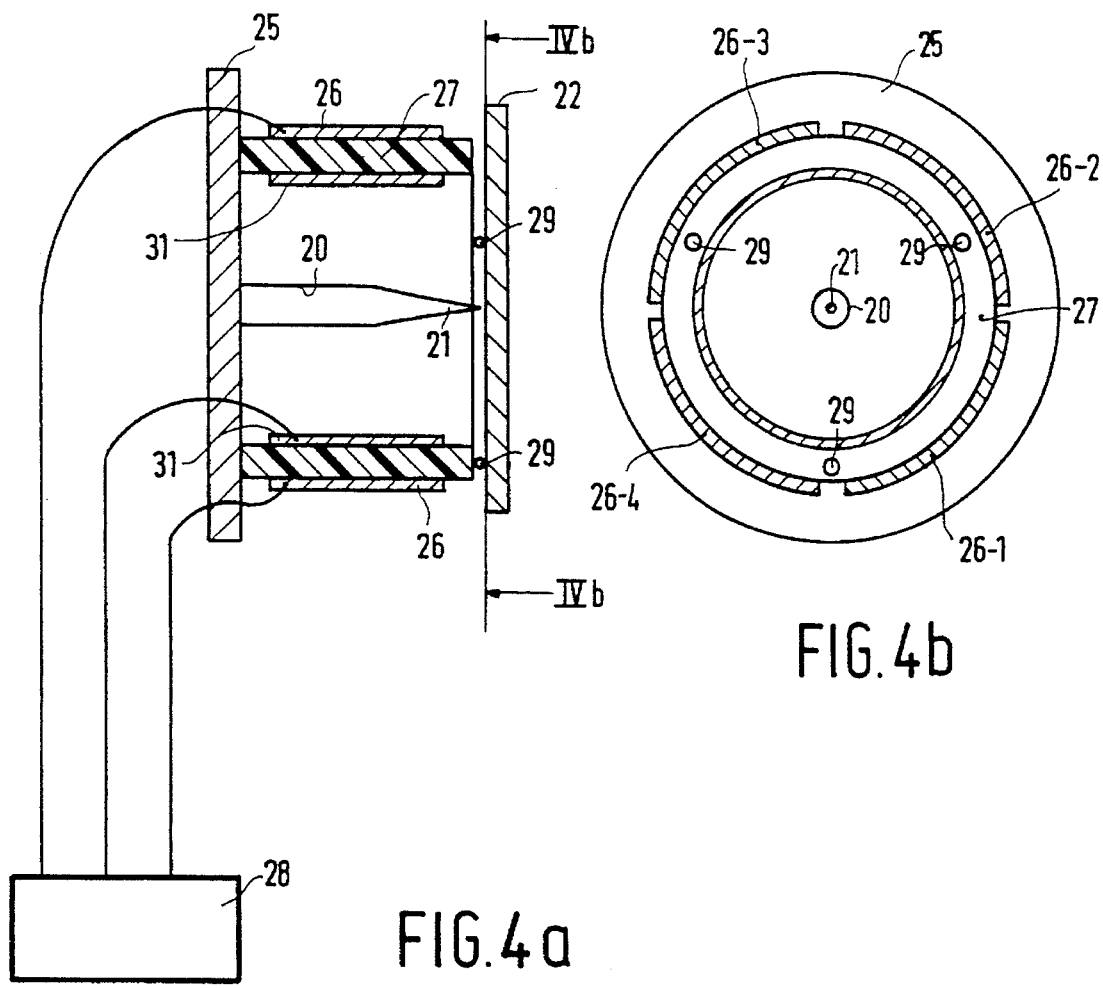
Figure 5:
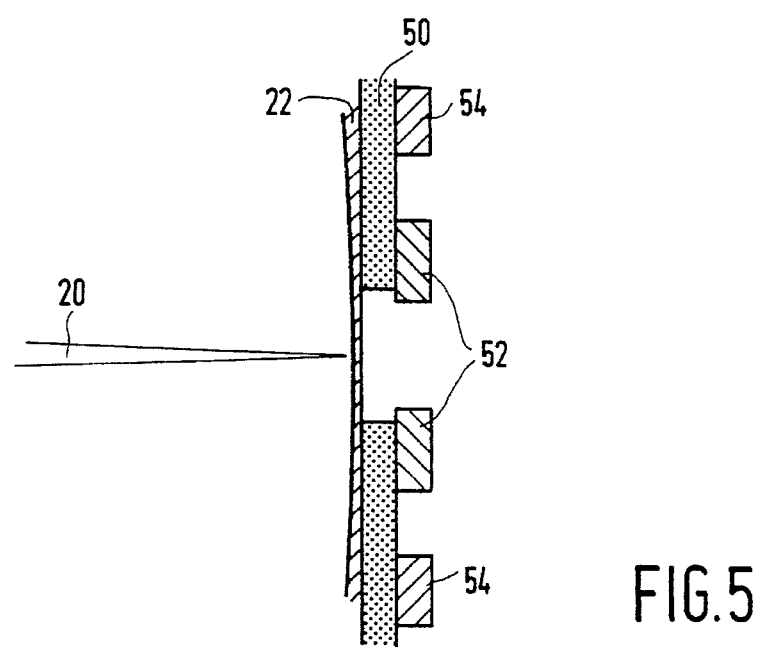
Figure 6:
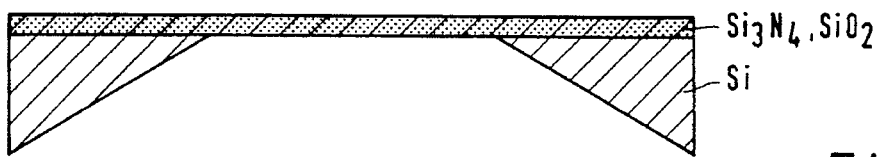
Figure 7:
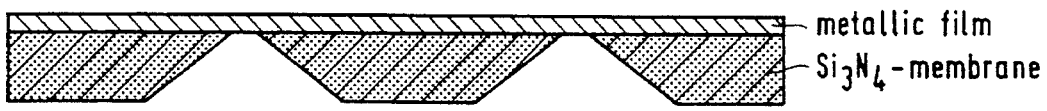
Figure 8:
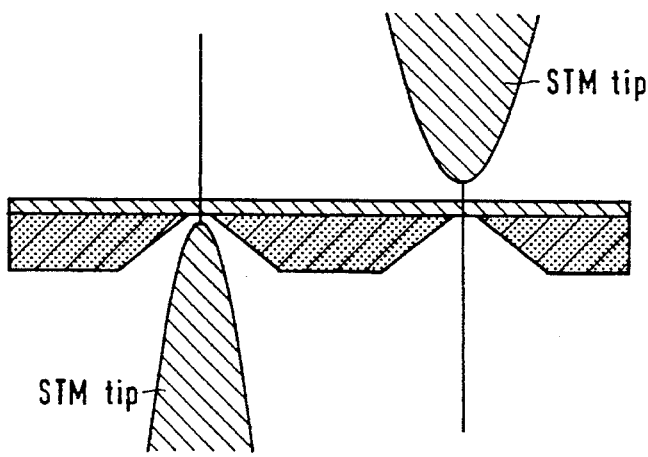
Figure 9:
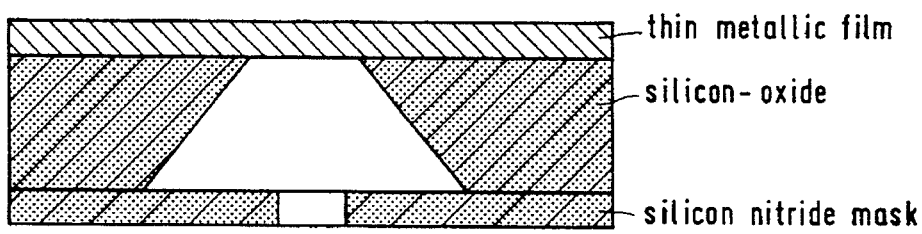
Figure 10:
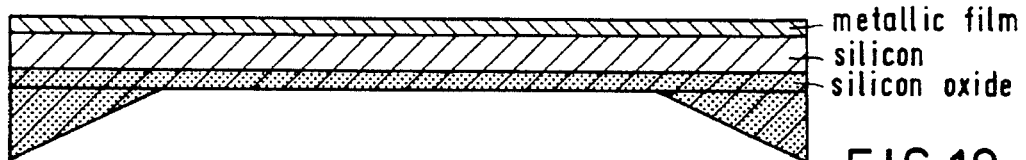

The invention will be described in detail hereinafter with reference to the Figures in which corresponding reference numerals denote corresponding elements. Therein:

FIG. 1 is a diagrammatic sectional view of a particle-optical apparatus in the form of an electron microscope comprising an electron source in accordance with the invention, FIG. 2 is a more detailed diagrammatic representation of an embodiment of the electron source in accordance with the invention, FIG. 3 is a diagrammatic representation of the potential variation within the electron source in accordance with the invention, FIG. 4a–b is a more detailed representation of the means for moving the needle within the electron source in accordance with the invention, FIG. 5 is a more detailed representation of an electrode configuration in the electron source in accordance with the invention, FIG. 6 illustrates a method of manufacturing, using anisotropic etching, a conductive membrane for use in an electron source in accordance with the invention, formed from a silicon wafer with a silicon nitride oxide layer, FIG. 7 shows a nanomembrane formed from a thin metal foil on a silicon membrane, FIG. 8 illustrates two possibilities for positioning the needle-shaped conductor relative to the membrane, FIG. 9 illustrates a method of manufacturing a conductive membrane formed from a combination of silicon oxide and silicon nitride, and FIG. 10 illustrates the use of an SOI wafer so as to manufacture a membrane wherefrom a nanomembrane can be formed.

DESCRIPTION OF THE INVENTION

FIG. 1 shows a particle-optical apparatus in the form of an electron microscope. The apparatus comprises an electron source 1, a beam alignment system 3, a beam diaphragm 4, a condensor lens 6, an objective lens 8, a beam scanning system 10, an object space 11 in which a specimen holder 13 is arranged, a diffraction lens 12, an intermediate lens 14, a projection lens 16 and an electron detector 18. The objective lens 8, the intermediate lens 14 and the projection lens 16 together constitute an imaging lens system. The above elements are accommodated in a housing 19 with an electric supply lead 2 for the electron source, a viewing window 7 and a vacuum pumping device 17. The excitation coils of the objective lens 8 are connected to a control unit 15 which is arranged to control the excitation of the imaging lens system. The electron microscope also comprises a recording unit which includes the electron detector 18, an image processing unit 5 and a video display 9 for observing the images formed.

FIG. 2 is a more detailed representation of the electron source 1 in accordance with the invention. A needle-shaped conductor 20 is provided with a sharp tip 21. The needle 20 is directed perpendicularly to a conductive membrane 22 which performs the function of extraction-electrode. A voltage difference can be applied between the extraction-electrode 22 and the needle 20 by means of a voltage source 24. The needle 20 is secured in a device 26 for displacing the needle tip parallel as well as perpendicularly to the extraction-electrode. This device is controlled by a displacement control system 28. The needle 20 is secured to a carrier plate 25 via the device 26.

The needle 20 has a tip 21 which is sharp but for the manufacture of the tip it is not necessary to pursue atomic sharpness, i.e. the needle tip need not be tapered down to the atomic level where its apex is formed by one or a few atoms. It is sufficient when the tip of the needle is so small that the needle can be arranged opposite a defined, sufficiently thin area of the extraction-electrode 22. Because of the remaining irregularity of the surface of the tip 21, protrusions still exist at an atomic scale and the protrusion situated nearest to the extraction-electrode will then automatically act as the emission point.

Any conductive material can in principle be chosen for the extraction-electrode 22; the optimum thickness of this electrode can be experimentally determined. It has been found that a gold membrane of a thickness of the order of magnitude of 10 nm results in a measurable current behind the extraction-electrode. The distance between the needle tip 21 and the extraction-electrode 22 can also be experimentally determined. The needle can be positioned opposite this electrode by means of techniques which are known from the Scanning Tunnelling Electron Microscopy technique. Using this technique, the needle tip can be positioned a distance as small as approximately 0.1 nm from the extraction-electrode.

Customary electron sources must be arranged in vacuum for suitable operation. In the electron source in accordance with the invention a vacuum must be present at the exit side of the extraction-electrode, but the needle need not necessarily be arranged in vacuum. It can be arranged in a space in which atmospheric conditions prevail; this offers major advantages in view of accessibility of the various parts of the source. Interventions in the electron source thus need not disturb the sometimes extremely low vacuum of the examination space of the particle-optical apparatus.

The electric voltage between the needle tip 21 and the extraction-electrode 22 is supplied by a voltage source 24. In said Tunnelling Microscopy technique it has been found that in the presence of a potential difference of from a few millivolts to some volts the electrostatic field around the foremost protrusion of the needle tip suffices to cause a tunnel current between the needle tip and the oppositely situated conductive surface. In the electron source in accordance with the invention the voltage between the needle 20 and the extraction-electrode 22 is of the same order of magnitude. Because of this comparatively low voltage (of the order of magnitude of 5 V), only insevere requirements need be imposed as regards the insulation of the insulating parts of the electron source. It is inter alia because of this low voltage that it is not necessary to arrange the needle in vacuum.

FIG. 3 shows an energy diagram of an electron forming part of the electron beam. This electron is emitted by the needle 20 and traverses the extraction-electrode 22, after which it is accelerated by the electric field between an anode 30 and the extraction-electrode 22. The needle 20, the extraction-electrode 22 and the anode 30 are diagrammatically represented as conductive regions in the Figure. The energy of the electron is plotted vertically thereabove as a function of (horizontally) the path travelled in the z-direction. The electron is initially present within the material of the needle 20. Because of the occurrence of the so-called quantum mechanical tunnel effect, the electron leaves the material without loss of energy and moves to and into the extraction-electrode 22. In order to enable emergence from the extraction-electrode again, it is necessary to overcome the work function $W_e$ of the material of the extraction-electrode 22. Between the needle 20 and the extraction-electrode 22 there is applied a voltage difference $V_{ne}$ which, therefore, must be larger than the work function of the material of the extraction-electrode. The amount whereby the voltage difference $V_{ne}$ exceeds the work function $W_e$ is referred to as the energy spread $\Delta E$ of the emitted electrons. The energy spread can be simply influenced by varying the voltage $V_{ne}$ between the needle and the extraction-electrode. Finally, the emitted electron is accelerated by the voltage difference $V_{ea}$ between the anode 30 and the extraction-electrode 22. This voltage difference $V_{ea}$ is substantially larger than the voltage difference $V_{ne}$ between the needle and the extraction-electrode but, because of the larger distance between the anode and the extraction-electrode, the electric field between anode and extraction-electrode is much smaller than that between the needle and the extraction-electrode.

FIG. 4 is a more detailed representation of an embodiment of means for varying the distance between the needle tip 21 and the extraction-electrode 22 during operation of the electron source, and also for moving the needle parallel to the surface of the extraction-electrode 22 during operation. FIG. 4a is a longitudinal sectional view of the device whereas FIG. 4b is a cross-sectional view of the carrier section of the device. On a carrier plate 25 there is secured a cylindrical piezoelement 27, the needle 20 being arranged on the centre line thereof. The membrane-like extraction-electrode 22 is positioned on the free upper edge of the piezoelement 27 via three spherical supports 29. The outer circumference of the piezoelement 27 is subdivided into four equal circular sectors, an electrode 26-1, 26-2, 26-3 or 26-4 being provided in each sector. On the entire inner circumference of the piezoelement 27 an electrode 31 is provided. By application of a voltage difference between one or more of the electrodes 26-1, 26-2, 26-3 or 26-4 on the one side and the electrode 31 on the other side, the length of the cylindrical piezoelement 27 can be varied in the direction of the cylinder axis. The voltage difference is supplied by a voltage source 28. When the four electrodes are excited by the same voltage, the extraction-electrode 22 will move in the axial direction. If a transverse displacement of the extraction-electrode 22 relative to the needle 20 is desired, for example the electrodes 26-1 and 26-2 are excited more than the electrodes 26-3 and 26-4 which are excited to the same extent. The extraction-electrode 22 is then displaced relative to the tip of the needle in a direction extending perpendicularly to the centre line passing through a point between the electrodes 26-1 and 26-4 and a point between the electrodes 26-2 and 26-3. Transverse displacements in other directions can be realised in a similar manner.

FIG. 5 shows an electrode configuration which is mechanically integral with the extraction-electrode 22. On the extraction-electrode there is provided a layer of insulator material 50 on which there is arranged a conductive ring 52. Via this ring an extraction field can be applied so as to accelerate the electrons after departure from the extraction-electrode. A second concentric ring 54 can be used to exert a focusing effect on the beam. However, it is also feasible to split this electrode 54 into segments so as to form a deflection field, or a multipole field for further manipulation of the beam, if desired. Because of the low operating voltages of the electron source in accordance with the invention, the assembly formed by the extraction-electrode and the insulator (insulators) and electrodes provided thereon can be easily constructed as micro-optical elements; for this purpose, use can be made of techniques which are known from microelectronics manufacture. The needle and, if desired, the displacement device 26 may also form part of the mechanical assembly.

FIGS. 6 to 10 illustrate a method of manufacturing the conductive membranes for use in an electron source in accordance with the invention.

The method of FIG. 6 starts with a standard silicon nitride (silicon oxide) membrane of thickness 0.1–1 μm and width 1–100 μm. The top surface is subsequently coated with a very thin continuous metallic layer. In order to achieve a continuous film for the required small thicknesses, presumably amorphous films will have to be used, i.e. AuSi, ZrCu .... The sandwich is subsequently exposed to high-energy heavy ions, for example $U^{238}$ at 100 MeV. These ions traverse the whole sandwich, thus producing so-called nuclear damage tracks in the insulator only. These damage tracks can be etched with some selectivity. In the case of an isotropic material, like the amorphous nitride or oxide, etching will produce an etch cone. Further information on nuclear damage tracks can be found in an article by B. E. Fischer and R. Spohhr, Reviews of Modern Physics 55, 907 (1983) and the references cited therein. The insulating layer is subsequently etched until the metallic film is reached. The resultant nanomembranes situated on a micromembrane, are shown in FIG. 7. Depending on the diameter of the nanomembranes and the tip sharpness (tip-apex radius), either the bottom or the top face can be used for the realisation as indicated in FIG. 8.

FIG. 9 shows a more elaborate process, using a combination of Si nitride and Si oxide. The nuclear damage track is etched in the thinner silicon nitride layer. A selective etch for the Si oxide is applied at a later stage so as to open up the oxide to the metallic foil, using the nitride as a mask. The Si-nitride is then stripped off.

FIG. 10 shows an alternative method. Therein, anisotropic etching of single crystalline Si is applied. To this end, a microfabricated silicon (not nitride/oxide) membrane is formed using an SOI (silicon on insulator) wafer. Subsequently, the metallic film is vapour deposited and the sandwich is exposed to heavy ions as described above. Nuclear damage tracks are readily formed in the oxide layer, but not so easily in silicon. The damage tracks are then etched, resulting in openings. Subsequently, the silicon can be etched using KOH, for example resulting in well-defined openings due to the anisotropic etching. Finally, the oxide is stripped off.

I claim:

1. A particle-optical apparatus, comprising an electron source (1) for producing a beam (23) of free electrons, said electron source being provided with:
   a needle-shaped conductor (20),
   a membrane-like, electrically conductive extraction-electrode (22) which is arranged opposite to and at a small distance from the tip (21) of the needle-shaped conductor (20),
   means (24) for applying an electric voltage between the needle-shaped conductor (20) and the extraction-electrode (22), characterized in that
   the membrane-like extraction-electrode (22) is completely closed, and
   the thickness of the extraction-electrode (22) is such that a practical fraction of electrons incident on the membrane under the influence of the electric voltage traverses the membrane to its other side with an energy loss which is negligibly small for all practical purposes.

2. A particle-optical apparatus as claimed in claim 1, characterized in that the means (24) for applying an electric voltage between the needle-shaped conductor (20) and the extraction-electrode (22) are adjustable to a value which exceeds the internal potential of the extraction-electrode (22) by an amount of between 1 mV and 1 V.

3. A particle-optical apparatus as claimed in claim 2, characterized in that the electron source (1) comprises means (26, 28) for varying the distance between the needle tip (21) and the extraction-electrode (22) during operation of the electron source.

4. A particle-optical apparatus as claimed in claim 3, characterized in that the electron source (1) comprises means for moving the needle tip (21) parallel to the surface of the extraction-electrode (22) during operation of the electron source.

5. A particle-optical apparatus as claimed in claim 1, characterized in that the extraction-electrode (22) is mechanically integral with further particle-optical elements (52, 54) for manipulating the beam (23) of free electrons.

6. A particle-optical apparatus as claimed in claim 1, characterized in that the extraction-electrode (22) also acts as a vacuum wall which constitutes a boundary between a vacuum space and the environment, the needle-shaped conductor (20) being present in said environment.

7. A particle-optical apparatus as claimed in claim 1, characterized in that the means (24) for applying an electric voltage between the needle-shaped conductor (20) and the extraction-electrode (22) are arranged to apply a pulsed voltage.

8. A particle-optical apparatus as claimed in claim 1, characterized in that the electron source comprises means for varying distance between the tip of the needle-shaped conductor and the extraction-electrode during operation of the electron source.

9. A particle-optical apparatus as claimed in claim 1, characterized in that the electron source comprises means for moving the tip of the needle-shaped conductor parallel to a surface of the extraction-electrode during operation of the electron source.

10. An electron source for producing a beam of free electrons comprising:

(a) a needle-shaped conductor, (b) a membrane-like, electrically conductive extraction-electrode which is arranged opposite to and at a small distance from a tip of the needle-shaped conductor, (c) means for applying an electric voltage between the needle-shaped conductor and the extraction-electrode, characterized in that the membrane-like, extraction-electrode is completely closed, and the extraction-electrode has a thickness such that a practical fraction of electrons incident on the membrane of the extraction-electrode under the influence of the electric voltage traverses the membrane to an opposite side with an energy loss which is negligibly small.

11. An electron source as claimed in claim 10, characterized in that the means for applying an electric voltage between the needle-shaped conductor and the extraction-electrode are adjustable to a value which exceeds the internal potential of the extraction-electrode by an amount of between 1 mV and 1 V.

12. An electron source as claimed in claim 11, characterized in that means are provided for varying distance between the tip of the needle-shaped conductor and the extraction-electrode during operation.

13. An electron source as claimed in claim 12, characterized in that means are provided for moving the tip parallel to a surface of the extraction-electrode during operation.

14. An electron source as claimed in claim 10, characterized in that the extraction-electrode is mechanically integral with further means for manipulating the beam of free electrons.

15. An electron source as claimed in claim 10, characterized in that the extraction-electrode also acts as a vacuum wall which constitutes a boundry between a vacuum space and the environment, the needle-shaped conductor being present in said environment.

16. An electron source as claimed in claim 10, characterized in that means are provided for varying distance between the tip of the needle-shaped conductor and the extraction-electrode during operation.

17. An electron source as claimed in claim 10, characterized in that means are provided for moving the tip of the needle-shaped conductor parallel to a surface of the extraction-electrode during operation.

* * * * *